(12) United States Patent
Ryu

(10) Patent No.: US 12,159,857 B2
(45) Date of Patent: Dec. 3, 2024

(54) SEMICONDUCTOR PACKAGE

(71) Applicant: SAMSUNG ELECTRONICS CO., LTD., Suwon-si (KR)

(72) Inventor: Jungseok Ryu, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 124 days.

(21) Appl. No.: 17/446,058

(22) Filed: Aug. 26, 2021

(65) Prior Publication Data

US 2022/0199567 A1    Jun. 23, 2022

(30) Foreign Application Priority Data

Dec. 22, 2020   (KR) .......................... 10-2020-0181329

(51) Int. Cl.
*H01L 25/065*     (2023.01)
*H01L 23/00*      (2006.01)

(52) U.S. Cl.
CPC .......... *H01L 25/0657* (2013.01); *H01L 24/05* (2013.01); *H01L 24/48* (2013.01); *H01L 24/73* (2013.01); *H01L 2224/05552* (2013.01); *H01L 2224/48091* (2013.01); *H01L 2224/48095* (2013.01); *H01L 2224/48096* (2013.01); *H01L 2224/48227* (2013.01); *H01L 2224/48451* (2013.01); *H01L 2224/73265* (2013.01); *H01L 2224/78301* (2013.01)

(58) Field of Classification Search
CPC ........................... H01L 24/48; H01L 2224/48
See application file for complete search history.

(56) References Cited

U.S. PATENT DOCUMENTS

| | | | |
|---|---|---|---|
| 6,112,974 A * | 9/2000 | Nishiura | B23K 20/005 219/56.22 |
| 6,316,190 B1 | 11/2001 | Nishiura | |
| 6,787,927 B2 | 9/2004 | Horibe | |
| 7,547,626 B2 | 6/2009 | Kwak | |
| 9,812,423 B2 | 11/2017 | Fukue | |
| 2011/0136334 A1* | 6/2011 | Ryu | H01L 24/48 438/612 |
| 2020/0066678 A1* | 2/2020 | Lee | H01L 24/85 |

FOREIGN PATENT DOCUMENTS

| | | |
|---|---|---|
| JP | H06-84991 | 3/1994 |
| JP | 4663179 | 3/2011 |
| JP | 60-9208 | 3/2017 |
| KR | 10-1143836 | 6/2012 |

* cited by examiner

*Primary Examiner* — Yu-Hsi D Sun
(74) *Attorney, Agent, or Firm* — F. CHAU & ASSOCIATES, LLC

(57) ABSTRACT

A semiconductor package includes a substrate that includes a bonding pad, a first semiconductor chip disposed on the substrate, a second semiconductor chip disposed on a top surface of the first semiconductor chip that is opposite to the substrate, a chip pad disposed on the top surface of the first semiconductor chip, and a bonding wire that connects the chip pad to the bonding pad. The bonding wire includes a first upward protrusion and a second upward protrusion that are convexly curved in a direction away from the substrate. The second semiconductor chip has a first side surface between the first upward protrusion and the second upward protrusion.

20 Claims, 17 Drawing Sheets

SEMICONDUCTOR PACKAGE

CROSS-REFERENCE TO RELATED APPLICATION

This U.S. nonprovisional application claims priority under 35 U.S.C § 119 from Korean Patent Application No. 10-2020-0181329, filed on Dec. 22, 2020 in the Korean Intellectual Property Office, the contents of which are herein incorporated by reference in their entirety.

BACKGROUND

Technical Field

Embodiments of the present inventive concepts are directed to a semiconductor package, and more particularly, to a semiconductor package that includes a bonding wire.

Discussion of the Related Art

A semiconductor package includes a substrate and a plurality of semiconductor chips stacked on the substrate. The plurality of semiconductor chips can be stacked through an adhesive film on the substrate. A bonding wire is connected between two neighboring stacked semiconductor chips. The bonding wire has a certain loop height. Because semiconductor packages used for current electronic products gradually decrease in size and thickness, various studies have been conducted to reduce the loop height of the bonding wire in the semiconductor package.

SUMMARY

Some embodiments of the present inventive concepts provide a semiconductor package that can securely and reliably connect structures while reducing a loop height of the bonding wires.

According to some embodiments of the present inventive concepts, a semiconductor package includes: a substrate that includes a bonding pad; a first semiconductor chip disposed on the substrate; a second semiconductor chip disposed on a top surface of the first semiconductor chip that is opposite to the substrate; a chip pad disposed on the top surface of the first semiconductor chip; and a bonding wire that connects the chip pad to the bonding pad. The bonding wire includes a first upward protrusion and a second upward protrusion that are convexly curved in a direction away from the substrate. The second semiconductor chip has a first side surface located between the first upward protrusion and the second upward protrusion.

According to some embodiments of the present inventive concepts, a semiconductor package includes: a substrate that has a top surface on which a bonding pad is disposed; a first semiconductor chip disposed on the top surface of the substrate; a chip pad disposed on a top surface of the first semiconductor chip; a second semiconductor chip disposed on the top surface of the first semiconductor chip, where the second semiconductor chip includes a first side surface located between the chip pad and the bonding pad; and a bonding wire that connects the chip pad to the bonding pad. The bonding wire includes: a first upward protrusion that is convexly curved in a direction away from the substrate; a second upward protrusion that is convexly curved in a direction away from the substrate, where the second upward protrusion is positioned between the first upward protrusion and the chip pad; and a downward protrusion positioned between the first upward protrusion and the second upward protrusion. The downward protrusion is convexly curved in a direction toward the substrate. The first side surface is located between the downward protrusion and the second upward protrusion.

According to some embodiments of the present inventive concepts, a semiconductor package includes: a substrate that has a top surface on which a bonding pad is disposed; a first semiconductor chip disposed on the top surface of the substrate; a chip pad disposed on a top surface of the first semiconductor chip; a conductive pattern disposed on the top surface of the first semiconductor chip, where the conductive pattern is located closer to a side surface of the first semiconductor chip than the chip pad; a passivation layer disposed on the top surface of the first semiconductor chip, where the passivation layer covers a portion of a top surface of the chip pad and a portion of a top surface of the conductive pattern; a second semiconductor chip disposed on a top surface of the passivation layer; and a bonding wire that connects the chip pad to the bonding pad. The bonding wire includes: a first upward protrusion that is convexly curved in a direction away from the substrate; a second upward protrusion that is convexly curved in a direction away from the substrate, where the second upward protrusion is positioned between the first upward protrusion and the chip pad; and a downward protrusion positioned between the first upward protrusion and the second upward protrusion. The downward protrusion is convexly curved in a direction toward the substrate. The conductive pattern is positioned between the downward protrusion and the second upward protrusion.

DETAILED DESCRIPTION

FIG. t is a cross-sectional view of a semiconductor package according to some embodiments of the present inventive concepts. FIG. 2A is an enlarged cross-sectional view of section A of FIG. 1. FIG. 2B is a plan view of a portion of a semiconductor package of FIG. 2A. FIG. 2C is an enlarged cross-sectional view of section B of FIG. 2A.

Figure 1:
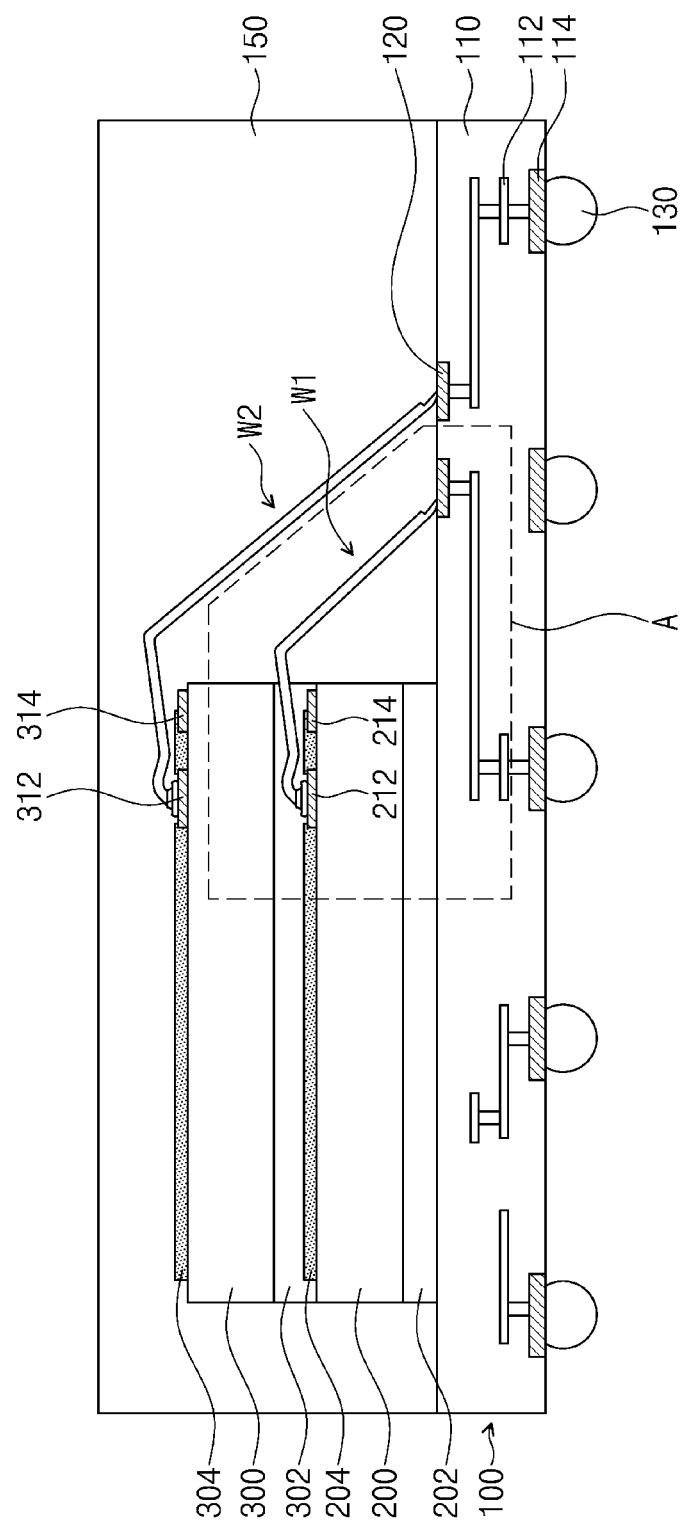
FIG. 1 illustrates a cross-sectional view of a semiconductor package according to some embodiments of the present inventive concepts.
Figure 2A:
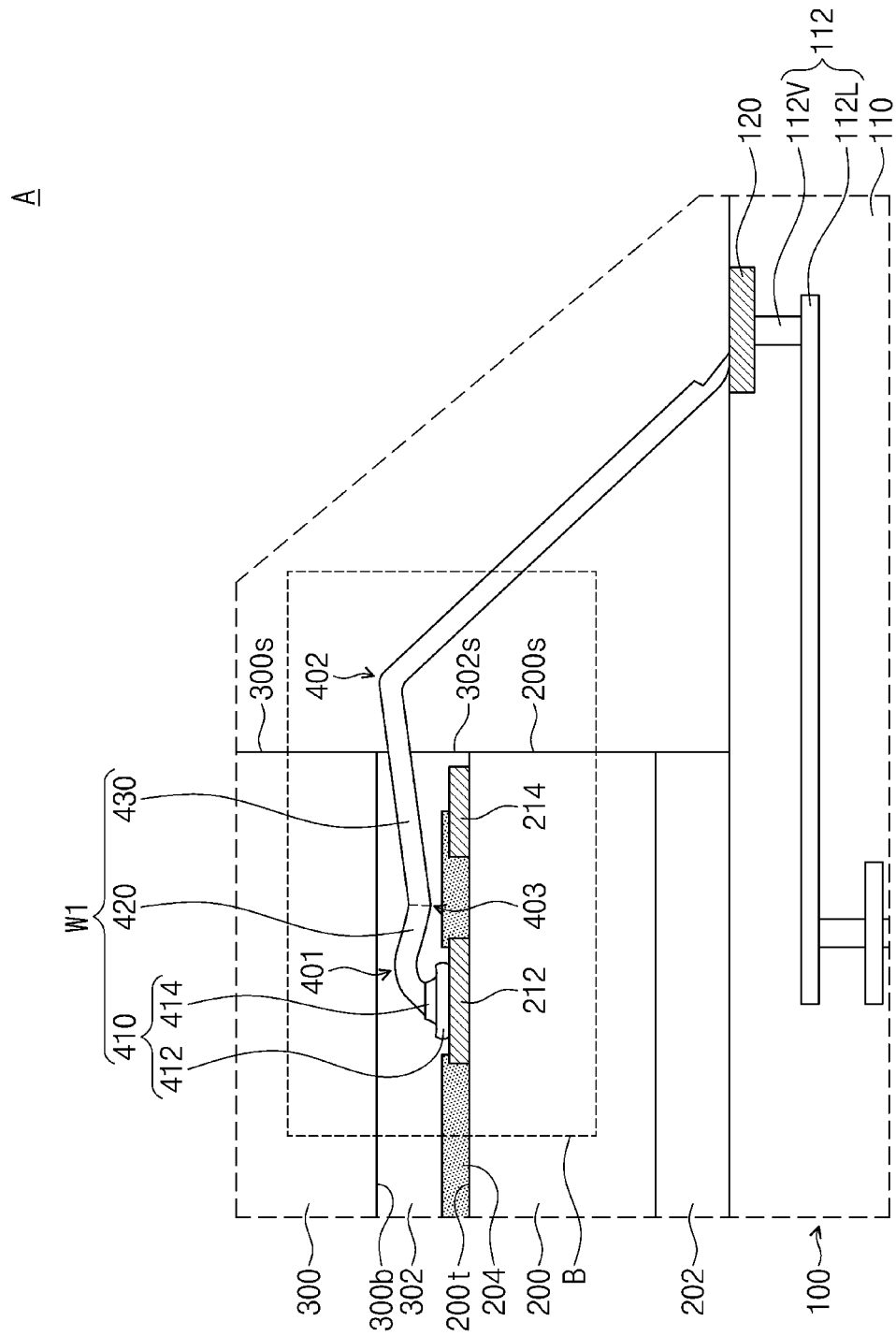
FIG. 2A illustrates an enlarged cross-sectional view of section A of FIG. 1.
Figure 2B:
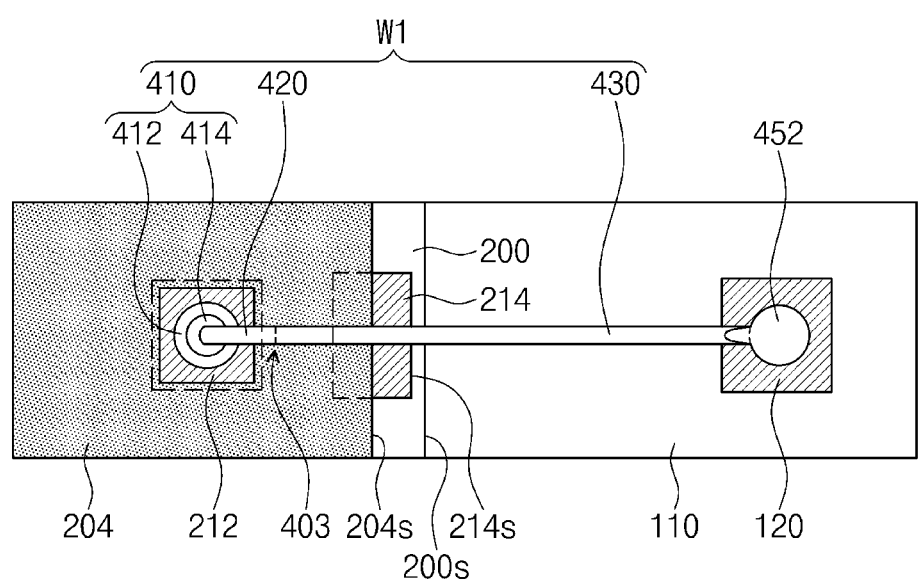
FIG. 2B is a plan view of a portion of a semiconductor package of FIG. 2A.
Figure 2C:
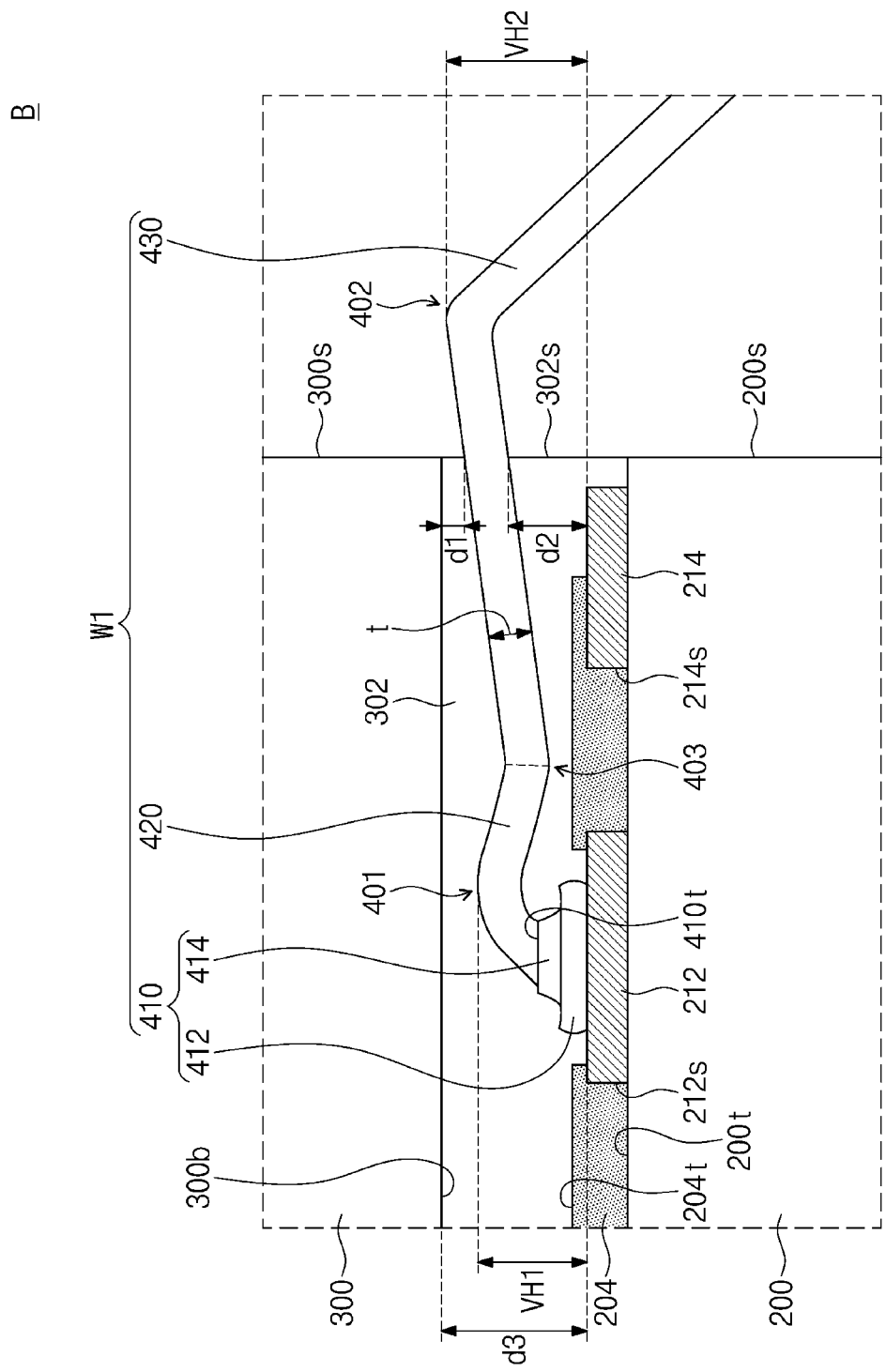
FIG. 2C is an enlarged cross-sectional view of section B of FIG. 2A.

Referring to FIGS. 1, 2A, and 2B, a semiconductor package according to some embodiments of the present inventive concepts includes a substrate 100, a first semiconductor chip 200, a second semiconductor chip 300, a molding member 150, a first bonding wire W1, and a second bonding wire W2.

According to some embodiments, the substrate 100 is disposed at a lower portion of the semiconductor package, and supports the first semiconductor chip 200 and the second semiconductor chip 300. The substrate 100 includes a body 110, an internal line 112, an upper conductive pad 120, and a lower conductive pad 114. For example, the substrate 100 may be one of a printed circuit board, an interposer substrate, or a redistribution substrate.

According to some embodiments, when the substrate 100 is a printed circuit board, the body 110 includes one of a polymeric material such as thermosetting resin, an epoxy-based resin such as flame retardant 4 (FR-4), bismaleimide triazine (BT), or ajinomoto build-up film, and a phenolic resin. When the substrate 100 is an interposer substrate or a redistribution substrate, the body 110 includes silicon, for example. According to some embodiments, an upper passivation layer is formed at an upper portion of the body 110, and a lower passivation layer is formed at a lower portion of the body 110. The upper and lower passivation layers include, for example, a solder resist.

According to some embodiments, a plurality of internal lines 112 are formed in the body 110. The internal line 112 may have a single-layered or multi-layered structure. The internal lines 112 include, for example, copper (Cu). The internal lines 112, as shown in FIG. 2A, have horizontally extending line parts 112L and vertically extending via parts 112V that connect with the line parts 112L. The internal lines 112 electrically connect one or more upper conductive pads 120 on a top surface of the body 110 to one or more lower conductive pads 114 on a bottom surface of the body 110. The internal lines 112 are electrically connected to the first semiconductor chip 200 and the second semiconductor chip 300 through the first and second bonding wires W1 and W2, respectively, that are connected to the upper conductive pads 120 on the top surface of the substrate 100.

According to some embodiments, one or more external connection terminals 130 are disposed on bottom surfaces of the lower conductive pads 114. The substrate 100 is electrically connected and mounted through the external connection terminals 130 onto a system board or module substrate of an electronic product. The external connection terminals 130 include, for example, solder balls.

According to some embodiments, the first and second semiconductor chips 200 and 300 are disposed on the substrate 100. The following will exemplarily describe the semiconductor package as including two semiconductor chips 200 and 300, but embodiments are not limited thereto, and no limitation is imposed on the number of semiconductor chips that can be stacked in the semiconductor package. For example, three or more semiconductor chips may be stacked in the semiconductor package, and a bonding wire is associated with each semiconductor chip to connect the semiconductor chip to the substrate.

According to some embodiments, the first and second semiconductor chips 200 and 300 are vertically stacked on the substrate 100. The first semiconductor chip 200 is electrically connected through the first bonding wire W1 to the substrate 100, and the second semiconductor chip 300 is electrically connected through the second bonding wire W2 to the substrate 100. The first and second semiconductor chips 200 and 300 may be memory chips and/or logic chips. For example, the first and second semiconductor chips 200 and 300 are the same kind of memory chip. For another example, one of the first and second semiconductor chips 200 and 300 is a memory chip, the other of the first and second semiconductor chips 200 and 300 is a logic chip. The memory chip may be a volatile or nonvolatile memory chip.

The nonvolatile memory chip may be, for example, a dynamic random access memory (DRAM), a static random access memory (SRAM), or a thyristor random access memory (TRAM). The nonvolatile memory chip may be, for example, a flash memory, a magnetic random access memory (MRAM), a spin-transfer torque magnetic random access memory (STT-MRAM), a ferroelectric random access memory (FRAM), a phase change random access memory (PRAM), or a resistive random access memory (RRAM). The logic chip may be, for example, a micro processor, a graphic processor, a signal processor, a network processor, a chip set, an audio codec, a video codec, an application processor, or a system-on-chip, but embodiments of the present inventive concepts are not limited thereto.

According to some embodiments, the first semiconductor chip 200 includes a semiconductor component layer. For example, the semiconductor component layer includes a switching component, such as transistor, and a memory component, such as capacitor. The first semiconductor chip 200 includes, for example, silicon (Si). In addition, the first semiconductor chip 200 may include at least one of a semiconductor element such as germanium and a compound semiconductor such as silicon carbide (SiC), gallium arsenide (GaAs), indium arsenide (InAs), or indium phosphide (InP). In addition, the first semiconductor chip 200 may include dielectric layers of silicon oxide and/or silicon nitride. According to some embodiments, the first semiconductor chip 200 has a silicon-on-insulator (SOI) structure.

According to some embodiments, a first adhesive layer 202 is disposed on a bottom surface of the first semiconductor chip 200. The first adhesive layer 202 couples the bottom surface of the first semiconductor chip 200 to the top surface of the substrate 100. The first adhesive layer 202 includes, for example, a die attach film (DAF). A die attach film may include an inorganic adhesive or a polymeric adhesive. The polymeric adhesive may include a thermosetting or thermoplastic resin. A thermosetting resin has a cross-link structure formed by heating a monomer, and does not soften even when re-heated. In contrast, a thermoplastic resin has plasticity obtained by heating, and has a linear polymer structure.

According to some embodiments, a first chip pad 212 is disposed on a top surface 200t of the first semiconductor chip 200. The first chip pad 212 is formed on and electrically connected to the semiconductor component layer in the first semiconductor chip 200. The first chip pad 212 includes at least one of aluminum (Al), copper (Cu), nickel (Ni), tungsten (W), platinum (Pt), or gold (Au).

According to some embodiments, a first conductive pattern 214 is formed on the top surface 200t of the first semiconductor chip 200. The first conductive pattern 214 is closer to an outer side of the first semiconductor chip 200 than the first chip pad 212. For example, the first semiconductor chip 200 has a side surface 200s between the first conductive pattern 214 and the upper conductive pad 120, and a distance between the first conductive pattern 214 and the side surface 200s is less than a distance between the first chip pad 212 and the side surface 200s. According to some embodiments, the first conductive pattern 214 has the same thickness as the first chip pad 212. The first conductive pattern 214 is formed of the same material as the first chip pad 212.

For example, according to some embodiments, the first conductive pattern 214 is a test pad that is used to test the first semiconductor chip 200 before the first semiconductor chip 200 is diced from a wafer into an individual die. For another example, the first conductive pattern 214 is a portion of a wiring line in the first semiconductor chip 200 or a portion of a moisture absorption structure that prevents moisture from penetrating into the first semiconductor chip 200. When the first conductive pattern 214 is a test pad or a portion of a wiring line, the first conductive pattern 214 is electrically connected to the semiconductor component layer in the first semiconductor chip 200. When the first conductive pattern 214 is a portion of a moisture absorption structure, the first conductive pattern 214 is electrically insulated from the semiconductor component layer in the first semiconductor chip 200.

According to some embodiments, a first passivation layer 204 is formed on the top surface 200t of the first semiconductor chip 200. The first passivation layer 204 protects the semiconductor component layer and other structures in the first semiconductor chip 200 from external impacts or moisture. The first passivation layer 204 may include an inorganic dielectric layer or an organic dielectric layer. For example, the first passivation layer 204 includes an organic dielectric layer, such as photosensitive polyimide (PSPI) or polybenzoxazole (PBO). The first passivation layer 204 has a thickness from about 3 µm to about 5 µm.

According to some embodiments, the first passivation layer 204 covers the top surface 200t of the first semiconductor chip 200, and also covers side surfaces 212s of the first chip pad 212. In addition, the first passivation layer 204 covers a portion of a top surface of the first chip pad 212, and exposes another portion of the top surface of the first chip pad 212. For example, the first passivation layer 204 has an opening that exposes a central portion of the top surface of the first chip pad 212, and in the opening, the first bonding wire W1 is electrically and physically connected to the first chip pad 212.

According to some embodiments, the first passivation layer 204 exposes a portion of the top surface 200t of the first semiconductor chip 200. The first passivation layer 204 does not cover an outer side of the top surface 200t of the first semiconductor chip 200. For example, as shown in FIG. 2B, the first passivation layer 204 has a side surface 204s that is closer to a central portion of the first semiconductor chip 200 than a side surface 200s of the first semiconductor chip 200.

According to some embodiments, the first passivation layer 204 covers a portion of a top surface of the first conductive pattern 214. In addition, the first passivation layer 204 covers at least one of the side surfaces 214s of the first conductive pattern 214. The first passivation layer 204 does not cover at least one of the side surfaces 214s of the first conductive pattern 214.

According to some embodiments, the second semiconductor chip 300 is mounted on the top surface 200t of the first semiconductor chip 200. The second semiconductor chip 300 includes, for example, silicon (Si). In addition, the second semiconductor chip 300 may include one or more materials discussed as exemplary materials of the first semiconductor chip 200. The second semiconductor chip 300 includes a semiconductor component layer.

According to some embodiments, the second semiconductor chip 300 has a side surface 300s between the first conductive pattern 214 and the upper conductive pad 120. The side surface 300s of the second semiconductor chip 300 is vertically aligned with the side surface 200s of the first semiconductor chip 200. The side surface 300s of the second semiconductor chip 300 is coplanar with the side surface 200s of the first semiconductor chip 200

According to some embodiments, a second adhesive film 302 is interposed between a bottom surface 300b of the second semiconductor chip 300 and the top surface 200t of the first semiconductor chip 200, and attaches the second semiconductor chip 300 to the first semiconductor chip 200. The second adhesive film 302 directly contacts a top surface of the first passivation layer 204 and encapsulates a portion of the first bonding wire W1. The second adhesive film 302 directly contacts top surfaces of the first chip pad 212 and the first conductive pattern 214 that are not covered by the first passivation layer 204. The second adhesive film 302 includes, for example, a die attach film (DAF). The second adhesive film 302 has a side surface 302s that is vertically aligned with the side surface 200s of the first semiconductor chip 200 and with the side surface 300s of the second semiconductor chip 300. The side surface 302s of the second adhesive film 302 is coplanar with the side surface 200s of the first semiconductor chip 200 and with the side surface 300s of the second semiconductor chip 300.

According to some embodiments, a second chip pad 312 is disposed on a top surface of the second semiconductor chip 300. The second chip pad 312 is formed on and electrically connected to the semiconductor component layer in the second semiconductor chip 300. The second chip pad 312 includes one or more materials discussed as exemplary materials of the first chip pad 212.

According to some embodiments, a second conductive pattern 314 is formed on the top surface of the second semiconductor chip 300. The second conductive pattern 314 is formed closer to a side surface 300s of the second semiconductor chip 300 than the second chip pad 312. For example, a distance between the second conductive pattern 314 and the side surface 300s of the second semiconductor chip 300 is less than a distance between the second chip pad 312 and the side surface 300s of the second semiconductor chip 300. The second conductive pattern 314 may be a test pad, a portion of a wiring line in the second semiconductor chip 300, or a portion of a moisture absorption structure that prevents moisture from penetrating into the second semiconductor chip 300.

According to some embodiments, a second passivation layer 304 is formed on the top surface of the second semiconductor chip 300. The second passivation layer 304 protects the semiconductor component layer and other structures in the second semiconductor chip 300 from external impacts or moisture. The second passivation layer 304 covers the top surface of the second semiconductor chip 300, and also covers side surfaces of the second chip pad 312. In addition, the second passivation layer 304 covers a portion of a top surface of the second chip pad 312, and exposes another portion of the top surface of the second chip pad 312. For example, the second passivation layer 304 has an opening that exposes a central portion of the top surface of the second chip pad 312, and in the opening, the second bonding wire W2 is electrically and physically connected to the second chip pad 312

According to some embodiments, the second passivation layer 304 exposes a portion of the top surface of the second semiconductor chip 300. The second passivation layer 304 does not cover an outer side of the top surface of the second semiconductor chip 300.

According to some embodiments, the second passivation layer 304 covers a portion of a top surface of the second conductive pattern 314. In addition, the second passivation layer 304 covers at least one of the side surfaces of the second conductive pattern 314, but does not cover all of the side surfaces of the second conductive pattern 314. The second passivation layer 304 includes one or more materials discussed as exemplary materials of the first passivation layer 204.

According to some embodiments, the molding member 150 encapsulates the first semiconductor chip 200, the second semiconductor chip 300, the first bonding wire W1, and the second bonding wire W2. The molding member 150 includes, for example, an epoxy molding compound. In some embodiments, the molding member 150 may be formed of an epoxy-based material, a thermosetting material, a thermoplastic material, a UV treatment material, or any suitable material other than an epoxy molding compound. The thermosetting material includes an acryl-polymer additive and a hardening agent of phenol, acid anhydride, or amine type.

According to some embodiments, the molding member 150 has side and top surfaces that meet at right angles to each other. In addition, the molding member 150 has, on its side or top surfaces, marking patterns such as a barcode, a numeral, a letter, and/or a symbol, that include information about the first semiconductor chip 200 and the second semiconductor chip 300.

According to some embodiments, the molding member 150 protects the first and second semiconductor chips 200 and 300 against external effects such as contamination and impact. To perform these functions, the molding member 150 has a thickness sufficient to encapsulate at least all of the first and second semiconductor chips 200 and 300. The molding member 150 completely covers the top surface of the substrate 100, and has a width that is substantially the same as that of the semiconductor package.

According to some embodiments, the first bonding wire W1 connects the first chip pad 212 to one of the upper conductive pads 120, and the second bonding wire W2 connects the second chip pads 312 to another of the upper conductive pads 120. The first and second bonding wires W1 and W2 respectively provide the first and second semiconductor chips 200 and 300 with input signals that are received through the substrate from the external connection terminal 130. The input signals include, for example, at least one of a control signal, a power signal, or a ground signal that operate the first semiconductor chip 200 and/or the second semiconductor chip 300. The first and second bonding wires W1 and W2 provide an external device with data that flows through the substrate 100 and is stored in the first semiconductor chip 200 and/or the second semiconductor chip 300.

The first and second bonding wires W1 and W2 are shown as being disposed adjacent to the side surfaces 200s and 300s of the first and second semiconductor chips 200 and 300, but embodiments are not, limited thereto, and no limitation is imposed on the arrangement of the bonding wires W1 and W2. According to some embodiments, the semiconductor package further includes bonding wires other than the first and second bonding wires W1 and W2, and the other bonding wires are disposed closer to other side surfaces of the first and second semiconductor chips 200 and 300. For example, in some embodiments, the semiconductor package includes bonding wires disposed directly on two or more surfaces of each of the first and second semiconductor chips 200 and 300.

According to some embodiments, the first and second bonding wires W1 and W2 include at least one metal, such as gold (Au), silver (Ag), copper (Cu), or aluminum (Al). According to some embodiments, one of a thermo-compression or an ultrasonic method may be used to connect the first and second bonding wires W1 and W2 to the first and second chip pads 212 and 312, respectively. Alternatively, a thermo-sonic method in which thermo-compression and ultrasonic methods are combined with each other can be used to connect the first and second bonding wires W1 and W2 to the first and second chip pads 212 and 312, respectively.

Referring to FIGS. 2A to 2C, according to some embodiments, the first bonding wire W1 includes a ball section 410, a neck section 420, and a loop section 430. In this description, the neck section 420 and the loop section 430 may be collectively referred to as a line section. The line section 420 and 430 have a thickness t that is less than that of the ball section 410. For example, the thickness t of the line section 420 and 430 ranges from about 15 µm to about 25 µm.

According to some embodiments, the ball section 410 is positioned on the top surface of the first chip pad 212. The ball section 410 includes a lower segment 412 in direct contact with the top surface of the first chip pad 212, and an upper segment 414 on the lower segment 412. The lower segment 412 is wider than the upper segment 414. The lower and upper segments 412 and 414 of the ball section 410 have a shape that corresponds to that of a tip of a capillary CA which will be discussed below. For example, each of the lower and upper segments 412 and 414 of the ball section 410 has a circular shape when viewed in a plan view. The lower and upper segments 412 and 414 may be integrally combined with each other into a single piece with no boundary.

According to some embodiments, the neck section 420 is positioned on the ball section 410. The neck section 420 extends from a top surface 410t of the ball section 410 to the side surfaces 200s and 300s of the first and second semiconductor chips 200 and 300. The neck section 420 is in direct contact with the top surface 410t of the ball section 410.

According to some embodiments, the neck section 420 has a first upward protrusion 401 that is convexly curved in a direction away from the substrate 100. At the first upward protrusion 401, the first bonding wire W1 has a slope that changes relative to the top surface of the substrate 100. For example, when viewed in the cross-section of FIG. 2C, the neck section 420 has a positive slope upward from the top surface 410t of the ball section 410 to a top end of the first upward protrusion 401. In addition, the neck section 420 has a negative slope downward from the top end of the first upward protrusion 401 to where the neck section 420 meets the loop section 430. The top end of the first upward protrusion 401 has a slope parallel to the top surface of the substrate 100, and the first upward protrusion 401 is adjacent to a top end of the neck section 420. The neck section 420 has a positive slope upwards and gradually approaches the bottom surface 300b of the second semiconductor chip 300 from the top surface 410t of the ball section 410. The neck section 420 is bent away from the bottom surface 300b of the second semiconductor chip 300 as the neck section 420 approaches the loop section 430 from the top end of the first upward protrusion 401. The neck section 420 meets the loop section 430 at a downward protrusion 403.

According to some embodiments, the loop section 430 connects the neck section 420 to the upper conductive pad 120. The loop section 430 has a second upward protrusion 402 that is convexly curved in a direction away from the substrate 100. The second upward protrusion 402 is positioned between the upper conductive pad 120 and the side surface 300s of the second semiconductor chip 300. For example, the second upward protrusion 402 is horizontally spaced apart from the first and second semiconductor chips 200 and 300, and does not vertically overlap the first and second semiconductor chips 200 and 300.

According to some embodiments, the side surface 200s of the first semiconductor chip 200 is positioned between the first upward protrusion 401 and the second upward protrusion 402. In addition, the side surface 300s of the second semiconductor chip 300 is positioned between the first upward protrusion 401 and the second upward protrusion 402. The second upward protrusion 402 has a top end at a level that is not higher than the bottom surface 300b of the second semiconductor chip 300.

According to some embodiments, the loop section 430 has a height that increases from the downward protrusion 403 to the second upward protrusion 402. An interval between the loop section 430 and the top surface 200t of the first semiconductor chip 200 increases as the loop section 430 approaches the side surface 200s of the first semiconductor chip 200, or the side surface 300s of the second semiconductor chip 300, from the downward protrusion 403. Therefore, even when the first bonding wire W1 bends toward the top surface 200t of the first semiconductor chip 200, the first bonding wire W1 is prevented from contacting the conductive structures on the top surface 200t of the first semiconductor chip 200. The loop section 430 extends from inside the second adhesive film 302 through a side surface 302s of the second adhesive film 302 toward an outside of the second adhesive film 302.

According to some embodiments, at a location where the side surface 300s of the second semiconductor chip 300 vertically overlaps the loop section 430, or on the side surface 302s of the second adhesive film 302, a first vertical interval d1 between the loop section 430 and the bottom surface 300b of the second semiconductor chip 300 is less than a second vertical interval d2 between the loop section 430 and a top surface of the first conductive pattern 214. The first vertical interval d1 is less the thickness t of the line section 420 and 430. The first vertical interval d1 ranges from about 2 µm to about 5 µm. When the first vertical interval d1 is less than about 2 µm, defects can occur due to contact between the first bonding wire W1 and the bottom surface 300b of the second semiconductor chip 300. When the first vertical interval d1 is greater than about 5 µm, a thickness d3 of the second adhesive film 302 may need to be increased, which reduces the thinness and compactness of a semiconductor package. The second vertical interval d2 ranges, for example, from about 15 µm to about 25 µm.

According to some embodiments, the top end of the first upward protrusion 401 has a first height VH1 from the top surface of the first chip pad 212. The top end of the second upward protrusion 402 has a second height VH2 from the top surface of the first chip pad 212. The second height VH2 is greater than the first height VH1. For example, the top end of the second upward protrusion 402 is located at a level higher than that of the top end of the first upward protrusion 401. The first height VH1 has a value from about 0.8 times to about 2 times the thickness of the line section 420 and 430. The first height VH1 ranges, for example, from about 15 µm to about 25 µm.

According to some embodiments, the second height VH2 has a value from about 2.5 times to about 4 times the thickness t of the line section 420 and 430. In other words, the second height VH2 is from about 1.25 times to about 5 times the first height VH1. In an embodiment, the second height VH2 is from about 1.5 times to about 3 times the first height VH1. The second height VH2 ranges, for example, from about 35 µm to about 45 µm. When the second height VH2 is less than about 35 µm, none of the first upward protrusion 401, the second upward protrusion 402, and the downward protrusion 403, which will be discussed below, can bend at sufficient angles, which decreases the reliability of the connection structures. In contrast, when the second height VH2 is greater than about 45 µm, the thickness d3 of the second adhesive film 302 may need to be increased, which reduces the thinness and compactness of a semiconductor package.

According to some embodiments, the downward protrusion 403 is formed between the neck section 420 and the loop section 430. The line section 420 and 430 is convexly curved in a direction toward the substrate 100 at the downward protrusion 403. For example, at the downward protrusion 403, the first bonding wire W1 has a slope that changes relative to the top surface of the substrate 100. The downward protrusion 403 has a negative slope relative to the top surface of the substrate 100 at a portion adjacent to the neck section 420, and has a positive slope relative to the top surface of the substrate 100 at another portion adjacent to the loop section 430. The downward protrusion 403 has a bottom end parallel to the top surface of the substrate 100.

According to some embodiments, because the first bonding wire W1 includes the downward protrusion 403, the first bonding wire W1 has a relatively small loop height. The bottom end of the downward protrusion 403 is located at a vertical level that is lower than that of the top surface 410t of the ball section 410. For example, the bottom end of the downward protrusion 403 is located at a level that is higher than a top surface of the lower segment 412 of the ball section 410 and is lower than a top surface of the upper segment 414 of the ball section 410. The bottom end of the downward protrusion 403 is spaced apart from a top surface 204t of the first passivation layer 204. The bottom end of the downward protrusion 403 is positioned between the first chip pad 212 and the first conductive pattern 214. The bottom end of the downward protrusion 403 vertically overlaps the top surface 204t of the first passivation layer 204. Therefore, even when the first bonding wire W1 bends toward the first semiconductor chip 200, the bottom end of the downward protrusion 403 is not electrically connected with any conductive structure on the first semiconductor chip 200.

As shown in FIG. 2B, according to some embodiments, the loop section 430 has a stitch segment 452 at an end adjacent to the upper conductive pad 120. For example, the first chip pad 212 and the first bonding wire W1 are joined to each other by a ball bonding method, and the upper conductive pad 120 and the first bonding wire W1 are joined to each other by a stitch bonding method. The stitch segment 452 has a width greater than that of the line section 420 and 430. In addition, the stitch segment 452 has a thickness that is less than the thickness t of the line section 420 and 430. The thickness of the stitch segment 452 is, for example, equal to or less than about 0.1 times the thickness t of the line section 420 and 430. The stitch segment 452 is in direct contact with the upper conductive pad 120.

Referring back to FIG. 1, according to some embodiments, the second bonding wire W2 connects the second chip pad 312 to one of the upper conductive pads 120. According to some embodiments, the second bonding wire W2 has a detailed structure the same as or similar to that of the first bonding wire W1. For example, the second bonding wire W2 includes two upward protrusions that protrude in a direction away from the substrate 100 and a downward protrusion between the two upward protrusions.

Figure 3:
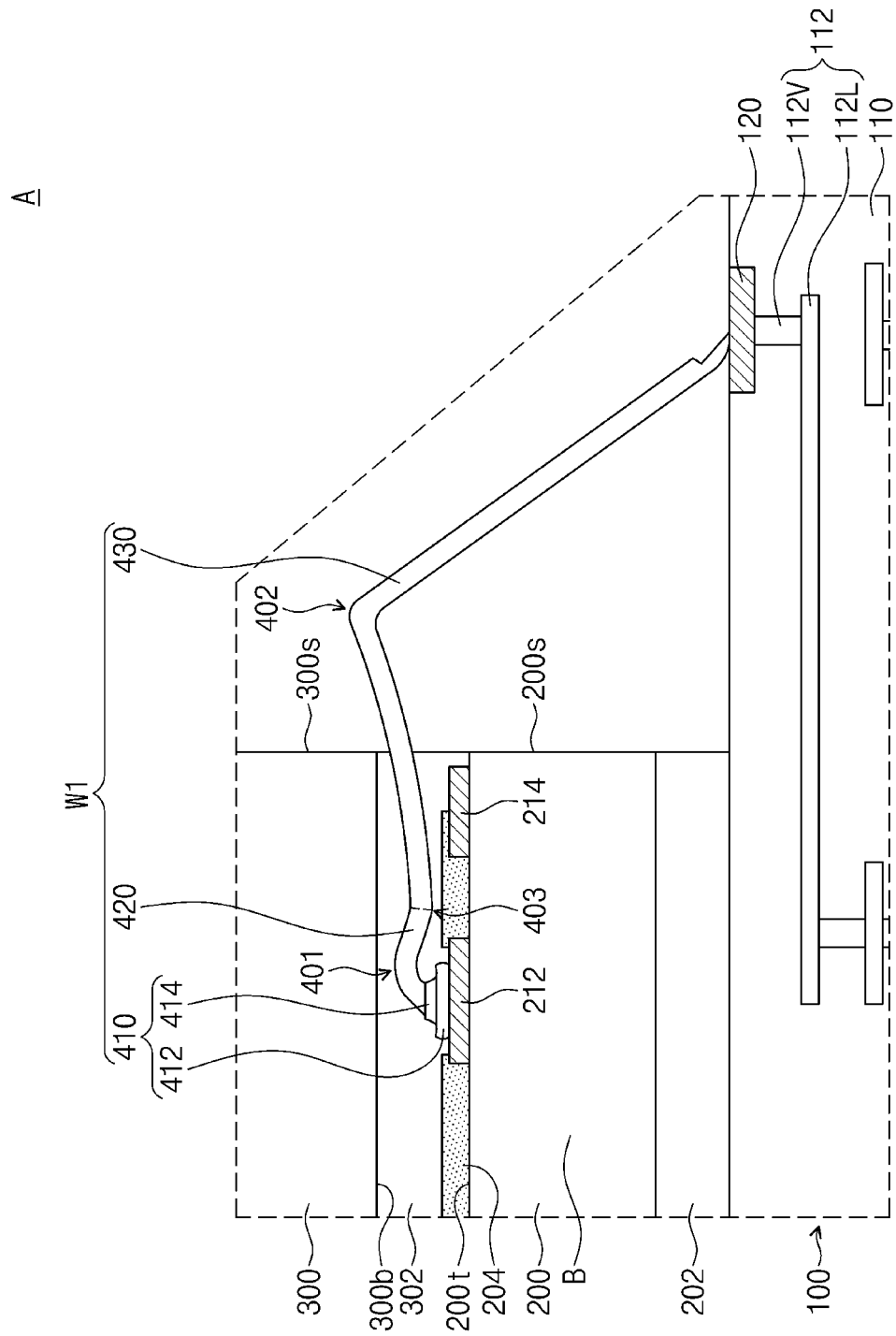
FIG. 3 is a cross-section view of section A in FIG. 1 that shows a semiconductor package according to some embodiments of the present inventive concepts.

FIG. 3 illustrates a cross-section view of section A in FIG. 1, which shows a semiconductor package according to some embodiments of the present inventive concepts. For brevity of description, detailed descriptions of components identical or similar to those described above will be omitted.

Referring to FIG. 3, according to some embodiments, the top end of the second upward protrusion 402 is located at a vertical level higher than that of the bottom surface 300b of the second semiconductor chip 300. According to some embodiments, the loop section 430 has a slope that gradually increases as the loop section 430 approaches second upward protrusion 402 from the downward protrusion 403.

Figure 4:
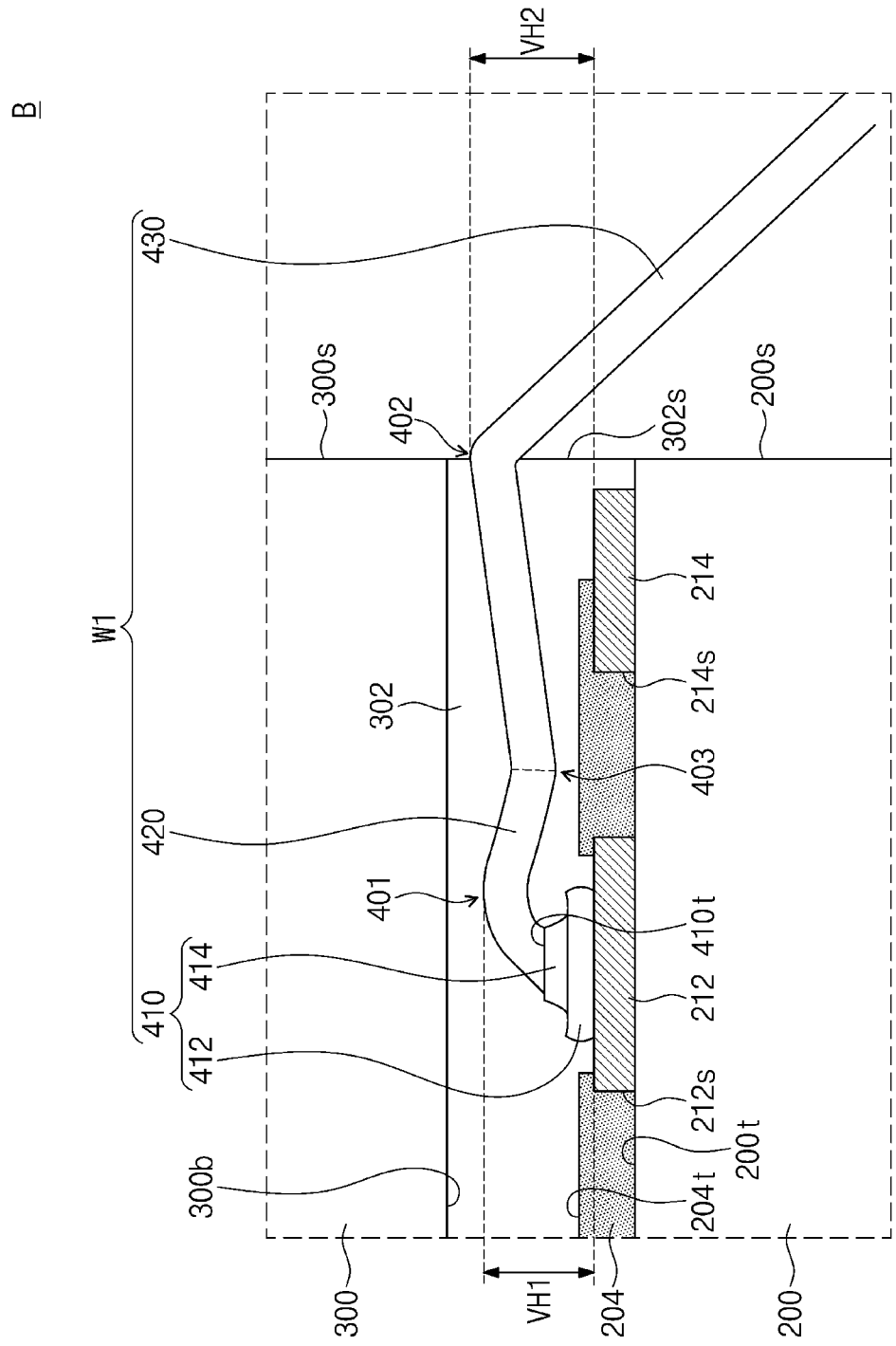
FIGS. 4 to 6 are cross-sectional views of section B in FIG. 2A that show a semiconductor package according to some embodiments of the present inventive concepts.
Figure 5:
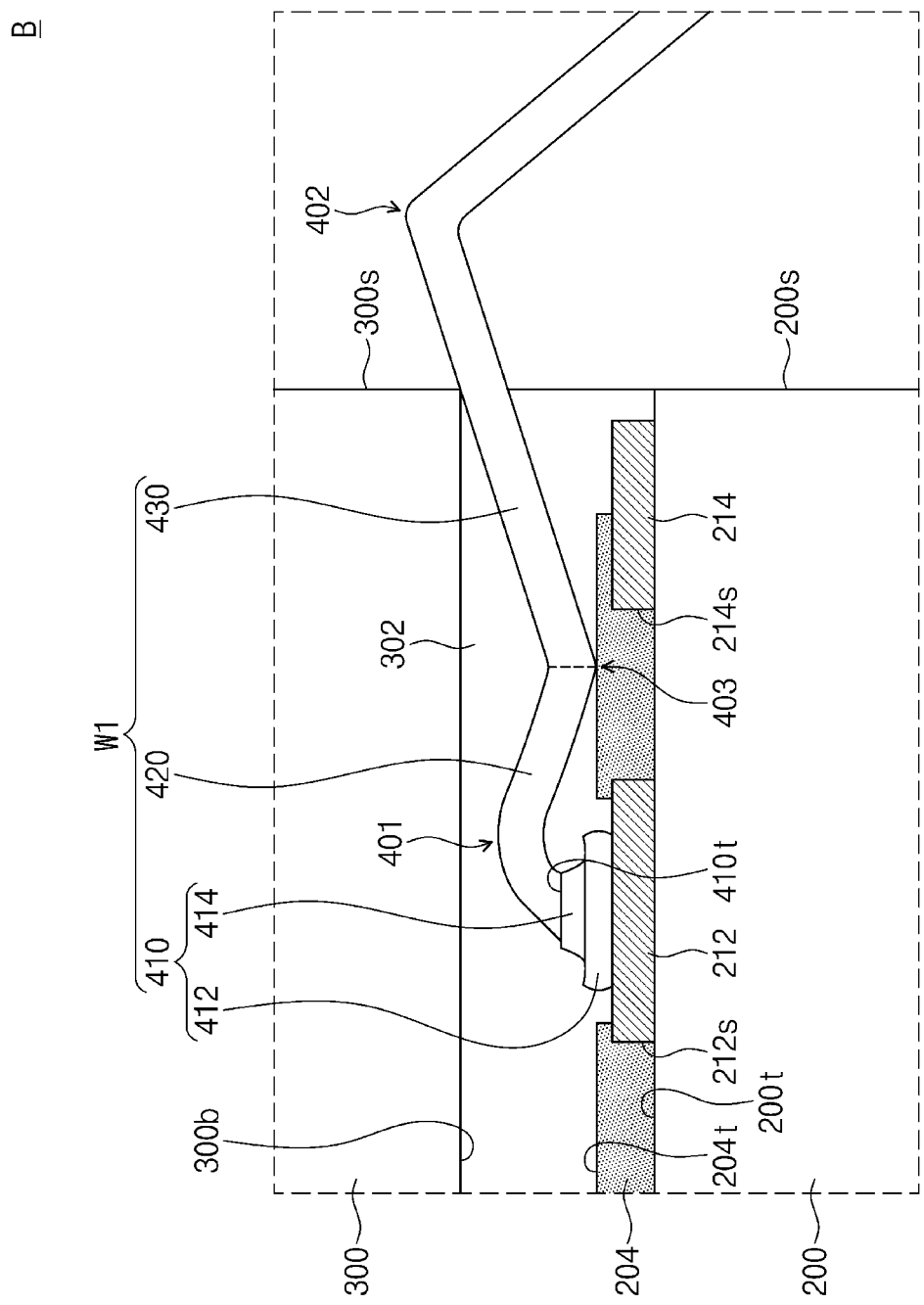
Figure 6:
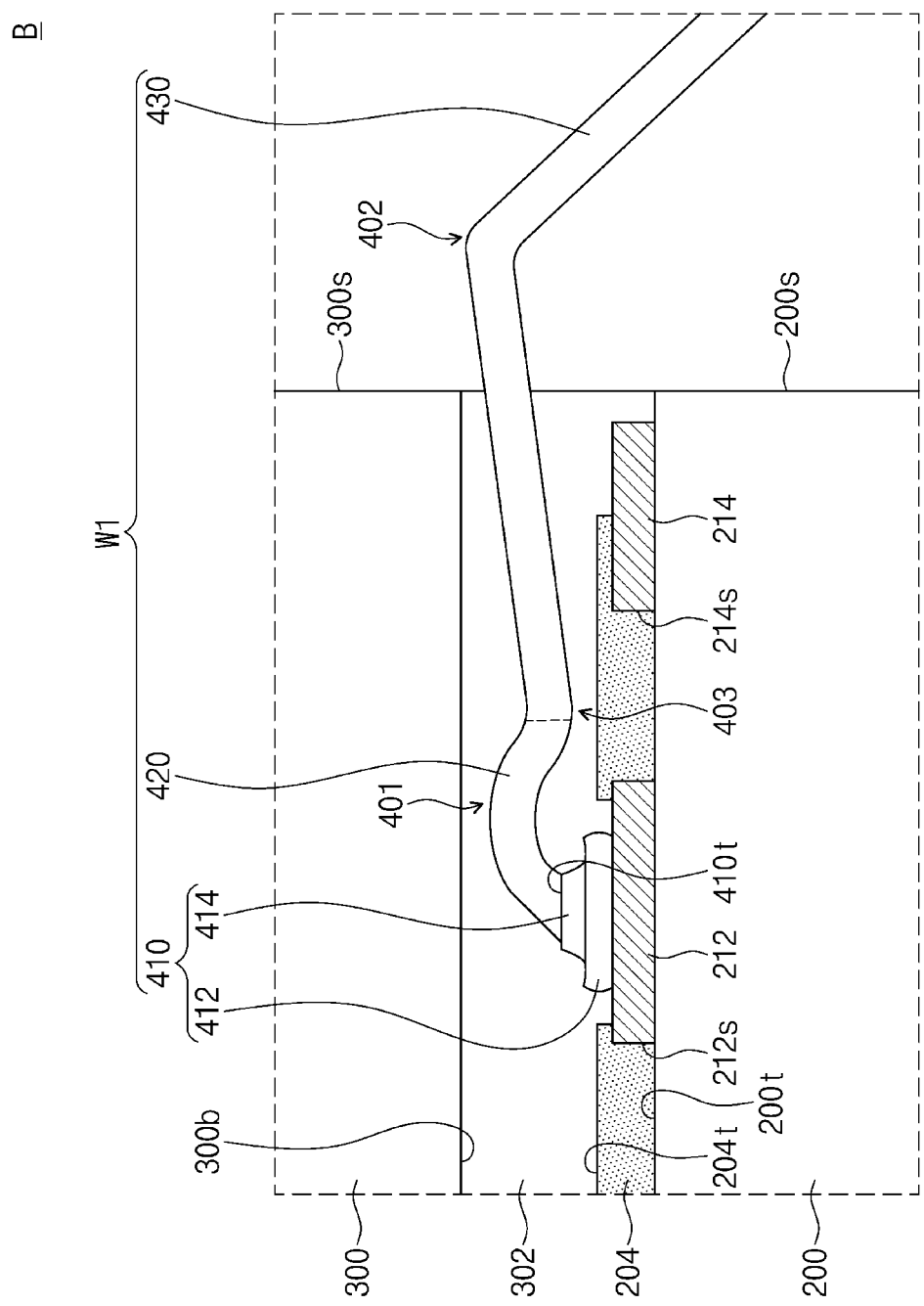

FIGS. 4 to 6 illustrate cross-sectional views of section B in FIG. 2A, which shows a semiconductor package according to some embodiments of the present inventive concepts. For brevity of description detailed descriptions of components identical or similar to those described above will be omitted.

Referring to FIG. 4, according to some embodiments, the second upward protrusion 402 of the first bonding wire W1 is adjacent to the side surface 302s of the second adhesive film 302. The second upward protrusion 402 is located at a vertical level that is higher than the top surface 200t of the first semiconductor chip 200 and is lower than the bottom surface 300b of the second semiconductor chip 300. An uppermost end of the second upward protrusion 402 vertically overlaps the side surface 200s of the first semiconductor chip 200 and the side surface 300s of the second semiconductor chip 300. As the uppermost end of the second upward protrusion 402 does not horizontally protrude from the side surface 200s of the first semiconductor chip 200 or the side surface 300s of the second semiconductor chip 300, when the second semiconductor chip 300 is mounted, damage to the first bonding wire W1 is prevented due to tolerances of the fabrication facility.

Referring to FIG. 5, according to some embodiments, the first bonding wire W1 is in contact with the bottom surface 300b of the second semiconductor chip 300. According to some embodiments, the second semiconductor chip 300 compresses the loop section 430 of the first bonding wire W1, and thus the neck section 420 of the first bonding wire W1 bends toward the first semiconductor chip 200. In this case, the neck section 420 includes the first upward protrusion 401 and has an arc shape, which prevents the neck section 420 from cut-off. In addition, the bending of the neck section 420 causes the downward protrusion 403 of the first bonding wire W1 to contact the top surface 204t of the first passivation layer 204. The downward protrusion 403 is positioned between the first chip pad 212 and the first conductive pattern 214 and vertically overlaps the top surface 204t of the first passivation layer 204, which prevents short-circuits.

Referring to FIG. 6, according to some embodiments, the first upward protrusion 401 has a curvature radius greater than that of the second upward protrusion 402. For example, the first upward protrusion 401 is bent more gently than the second upward protrusion 402. The top end of the first upward protrusion 401 is horizontally spaced apart from the ball section 410. For example, the top end of the first upward protrusion 401 does not vertically overlap the ball section 410.

FIGS. 7 to 15 are cross-sectional views that illustrate a method of fabricating a semiconductor package according to some embodiments of the present inventive concepts.

Figure 7:
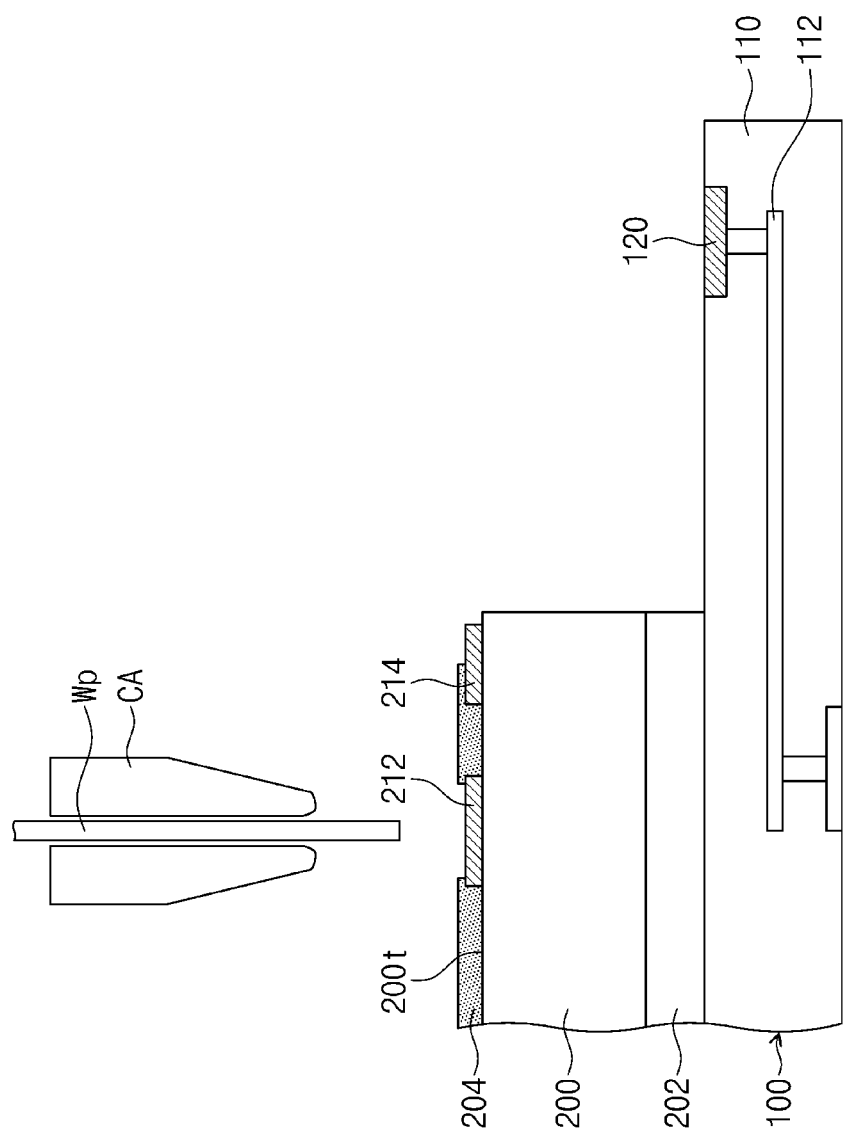
FIGS. 7 to 15 are cross-sectional views that illustrate a method of fabricating a semiconductor package according to some embodiments of the present inventive concepts.

Referring to FIG. 7, according to some embodiments, a substrate 100 is provided that has a first semiconductor chip 200 mounted on a top surface thereof. A first chip pad 212 and a first conductive pattern 214 are disposed on a top surface 200t of the first semiconductor chip 200. A first passivation layer 204 is disposed on the top surface 200t of the first semiconductor chip 200 and partially covers the first chip pad 212 and the first conductive pattern 214.

According to some embodiments, a capillary CA is provided on the first chip pad 212. A wire Wp is provided in a center hole of the capillary CA. The wire Wp includes one of gold (Au), silver (Ag), copper (Cu), or aluminum (Al). The wire Wp is withdrawn from a tip of the capillary CA to a predetermined length.

Figure 8:
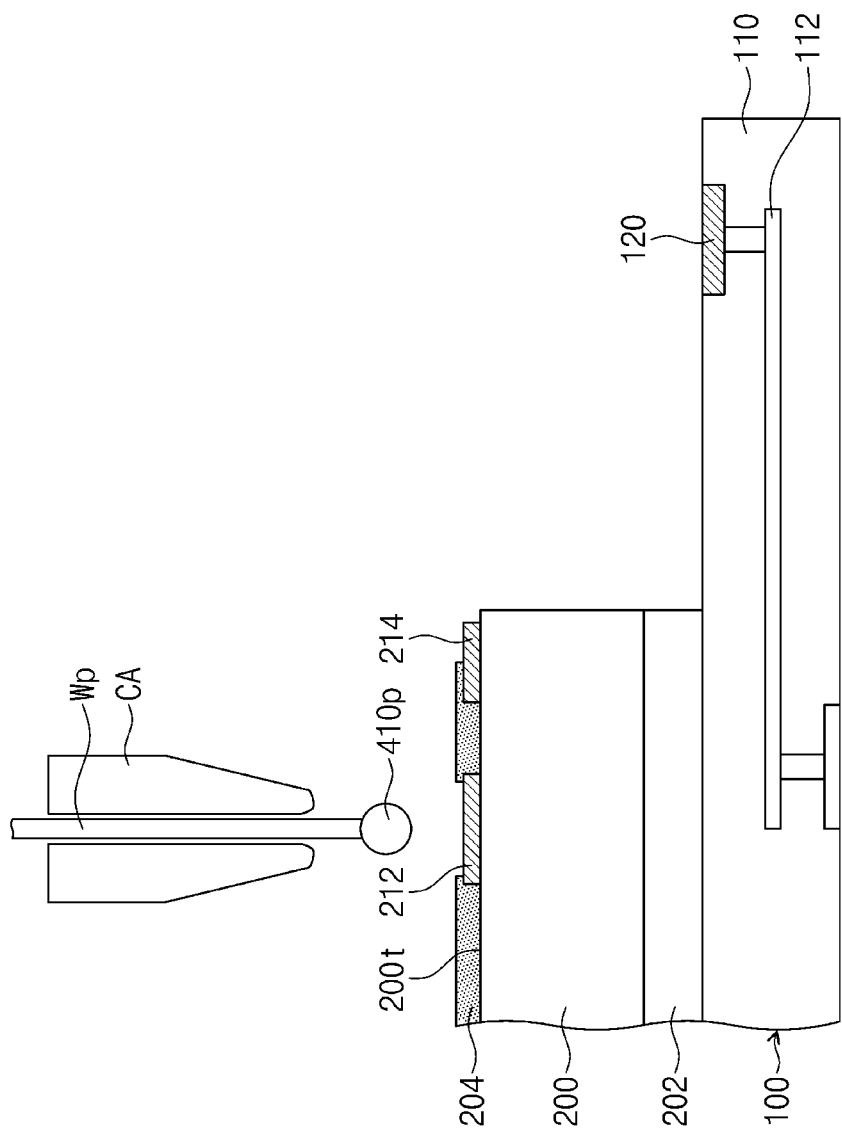

Referring to FIG. 8, according to some embodiments, the wire Wp withdrawn from the capillary CA is melted to form a free air ball 410p. For example, melting the wire Wp includes providing an electric spark to an end of the wire Wp. For another example, melting the wire Wp includes providing the end of the wire Wp with supersonic waves or thermal energy instead of the electric spark. The free air ball 410p has a diameter greater than a width of the wire Wp. The free air ball 410p has a spherical shape.

Figure 9:
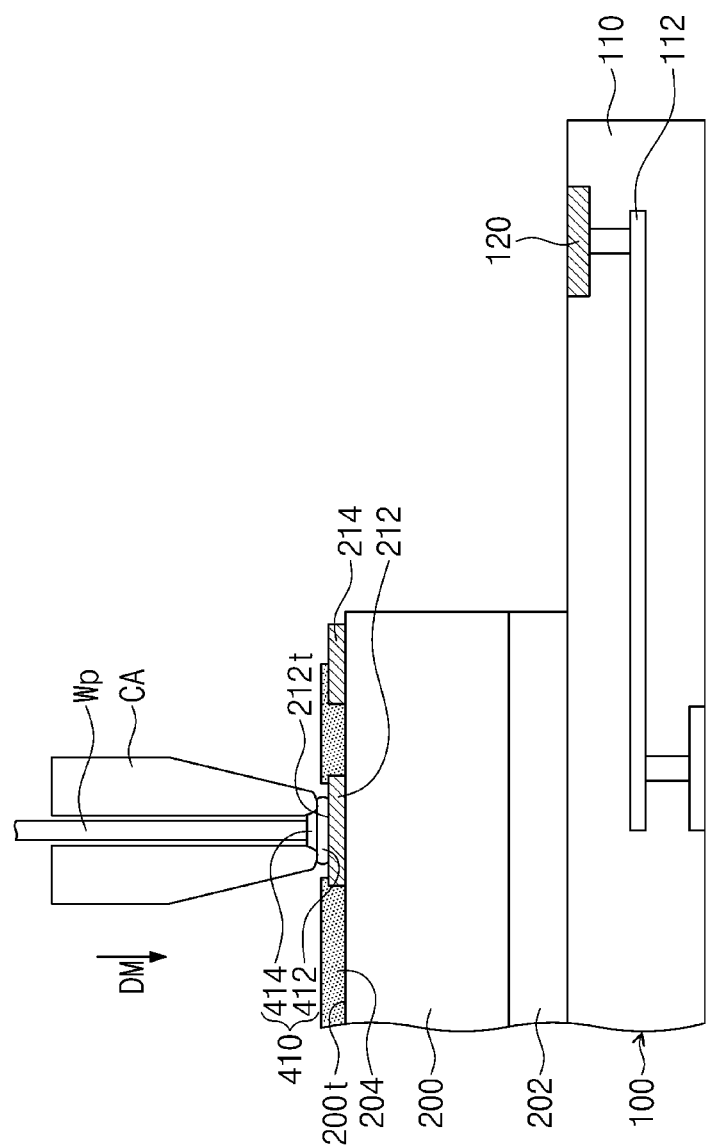

Referring to FIG. 9, according to some embodiments, the capillary CA moves and forms a ball section 410 on a top surface 212t of the first chip pad 212. The capillary CA moves along a predetermined movement path DM. The capillary CA vertically moves in a direction toward the first chip pad 212, and compresses the free air ball 410p against the top surface 212t of the first chip pad 212. At this stage, the capillary CA does not move horizontally. The tip of the capillary CA compresses a first portion of the free air ball 410p, and the compressed first portion of the free air ball 410p forms a lower segment 412 of the ball section 410. The free air ball 410p has second portion compressed by an inner surface of the center hole of the capillary CA, and the compressed second portion of the free air ball 410p forms an upper segment 414 of the ball section 410.

Figure 10:
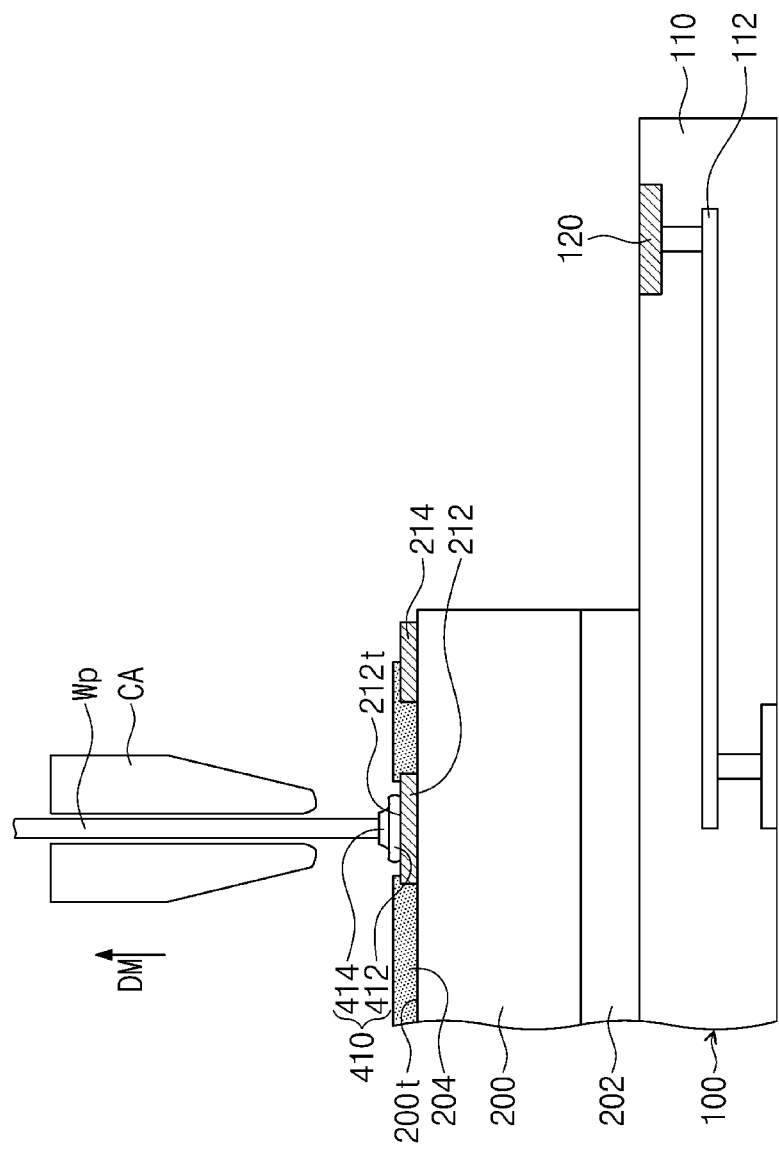

Referring to FIG. 10, according to some embodiments, the capillary CA moves vertically in a direction away from the first chip pad 212, while extracting the wire Wp. At this stage, the capillary CA can move vertically, but not horizontally.

Figure 11:
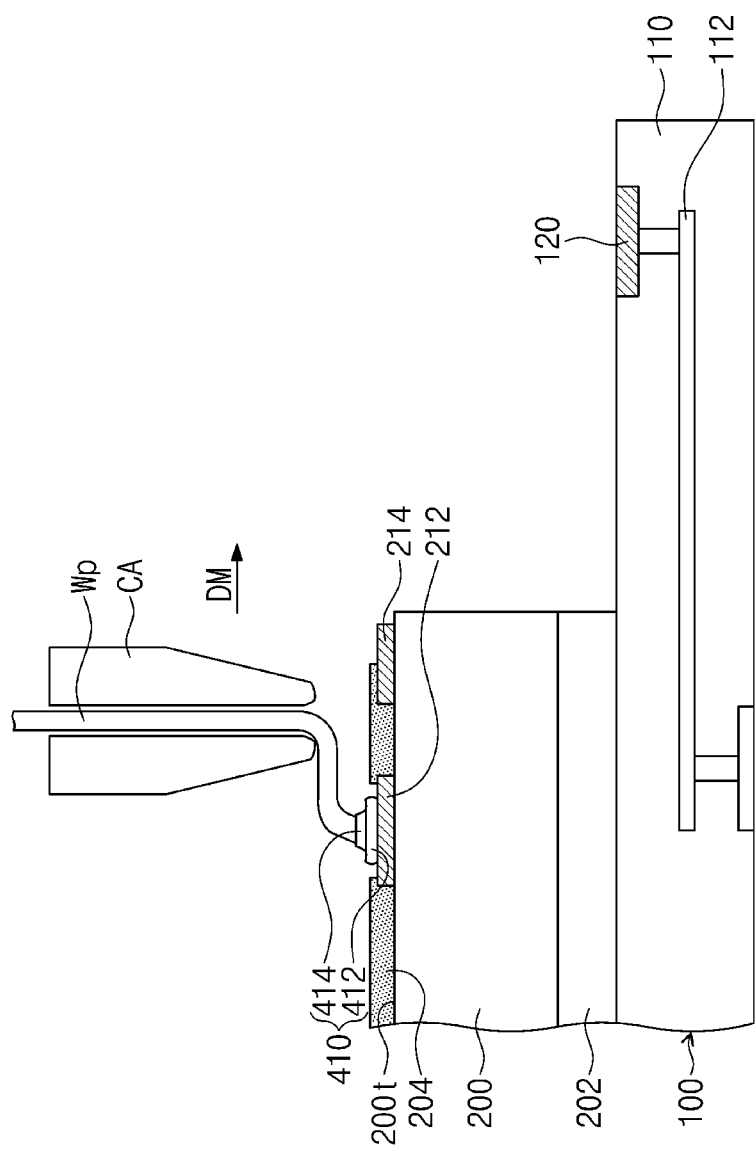

Referring to FIG. 11, according to some embodiments, the capillary CA moves horizontally in a direction, such as a forward direction, toward a location where an upper conductive pad 120 is positioned. In some embodiments of the present inventive concepts, the capillary CA is horizontally driven to move only in the forward direction, not a reverse direction, which reduces the time needed to form bonding wires. In addition, as the capillary CA is driven to move only in the forward direction, no excessive curvature is generated in forming a neck section 420, which will be discussed below, and the neck section 420 is provided with a uniform thickness. Therefore, it may be possible to prevent cut-off of the neck section 420, which will be subsequently formed.

Figure 12:
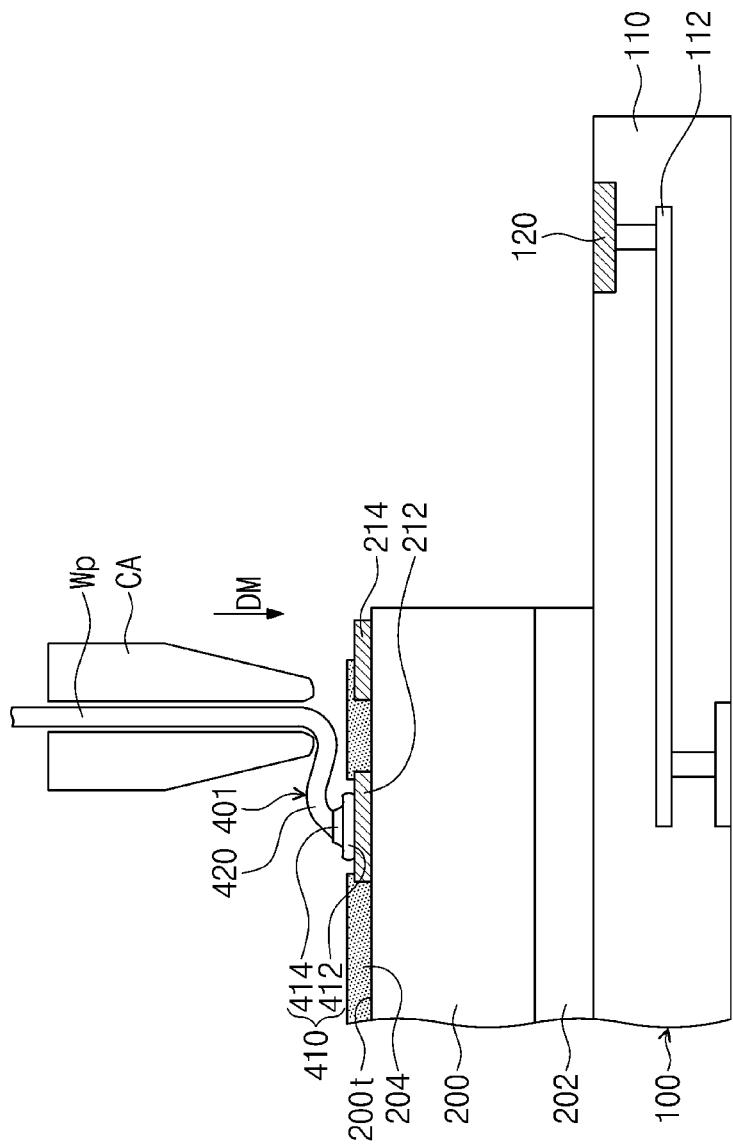

Referring to FIG. 12, according to some embodiments, the capillary CA descends in a vertical direction, while restricting withdrawal of the wire Wp. The restriction of the withdrawal of the wire Wp includes closing a clamp of the capillary CA. Therefore, a neck section 420 is formed that has a first upward protrusion 401.

Figure 13:
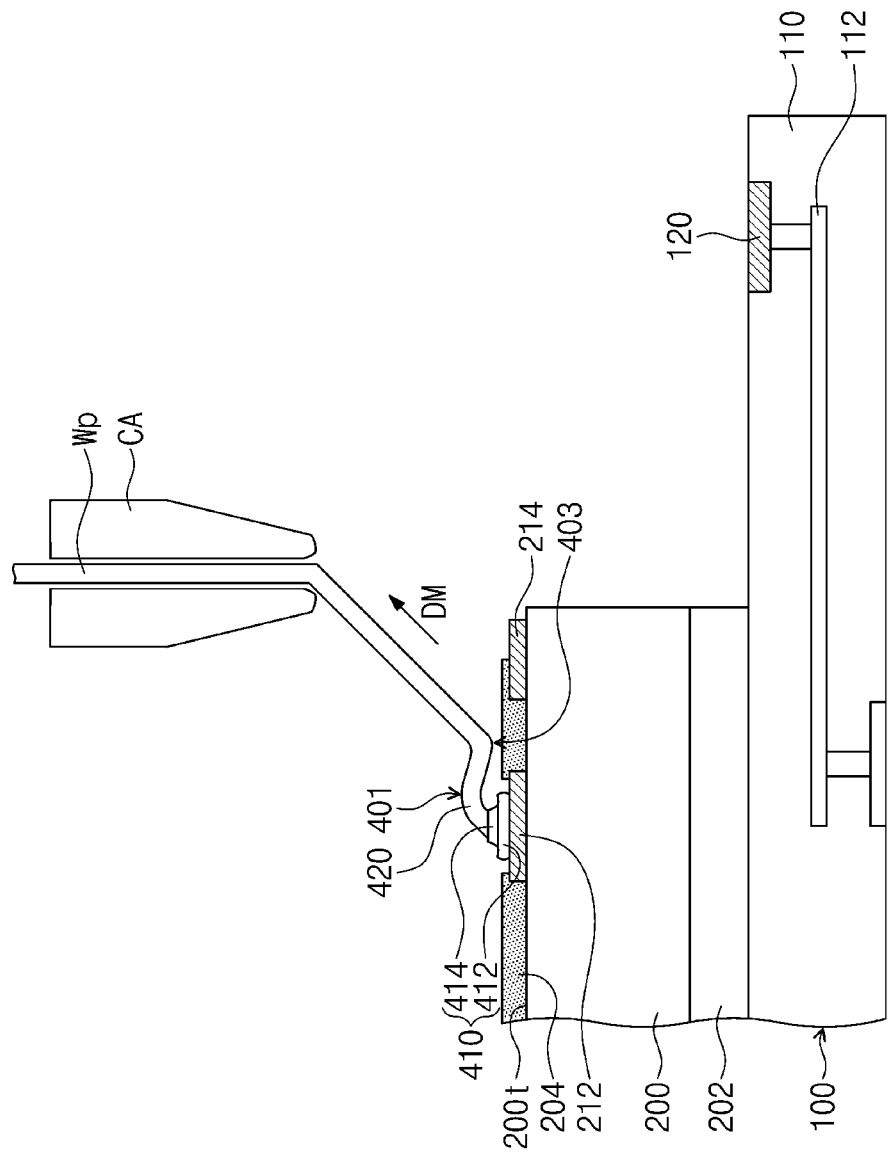

Referring to FIG. 13, according to some embodiments, the capillary CA moves in horizontal and vertical directions, i.e., a diagonal direction, while withdrawing the wire Wp. The capillary CA moves obliquely in a direction away from the substrate 100 and the first chip pad 212.

Figure 14:
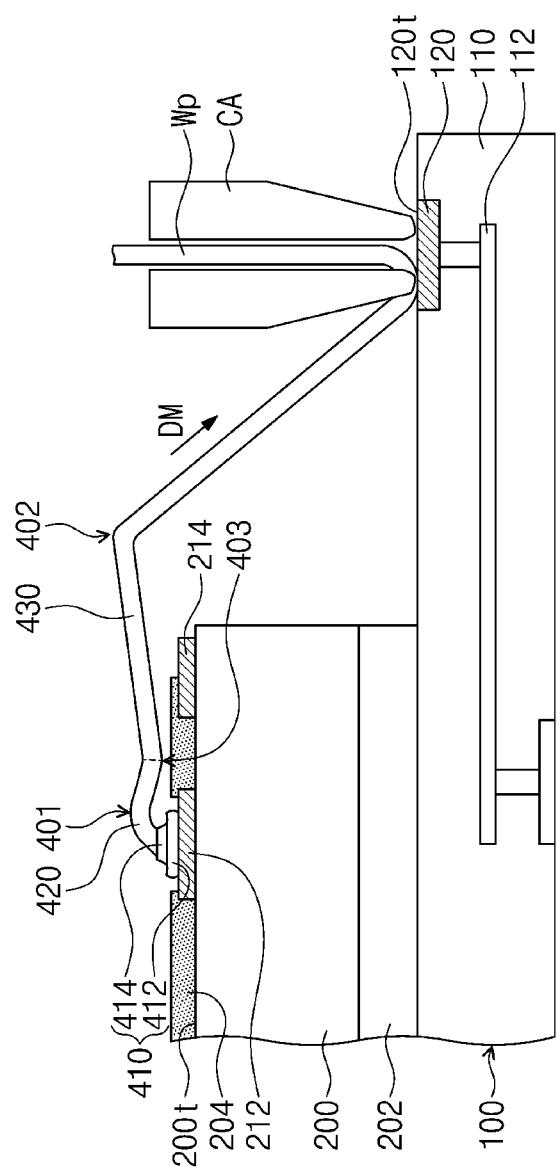

Referring to FIG. 14, according to some embodiments, the capillary CA moves toward the upper conductive pad 120, and thus forms a loop section 430. The tip of the capillary CA compresses the wire Wp, such that the wire Wp is cut off at a portion adjacent to the upper conductive pad 120. Therefore, a first bonding wire W1 is formed as shown in FIG. 15.

Figure 15:
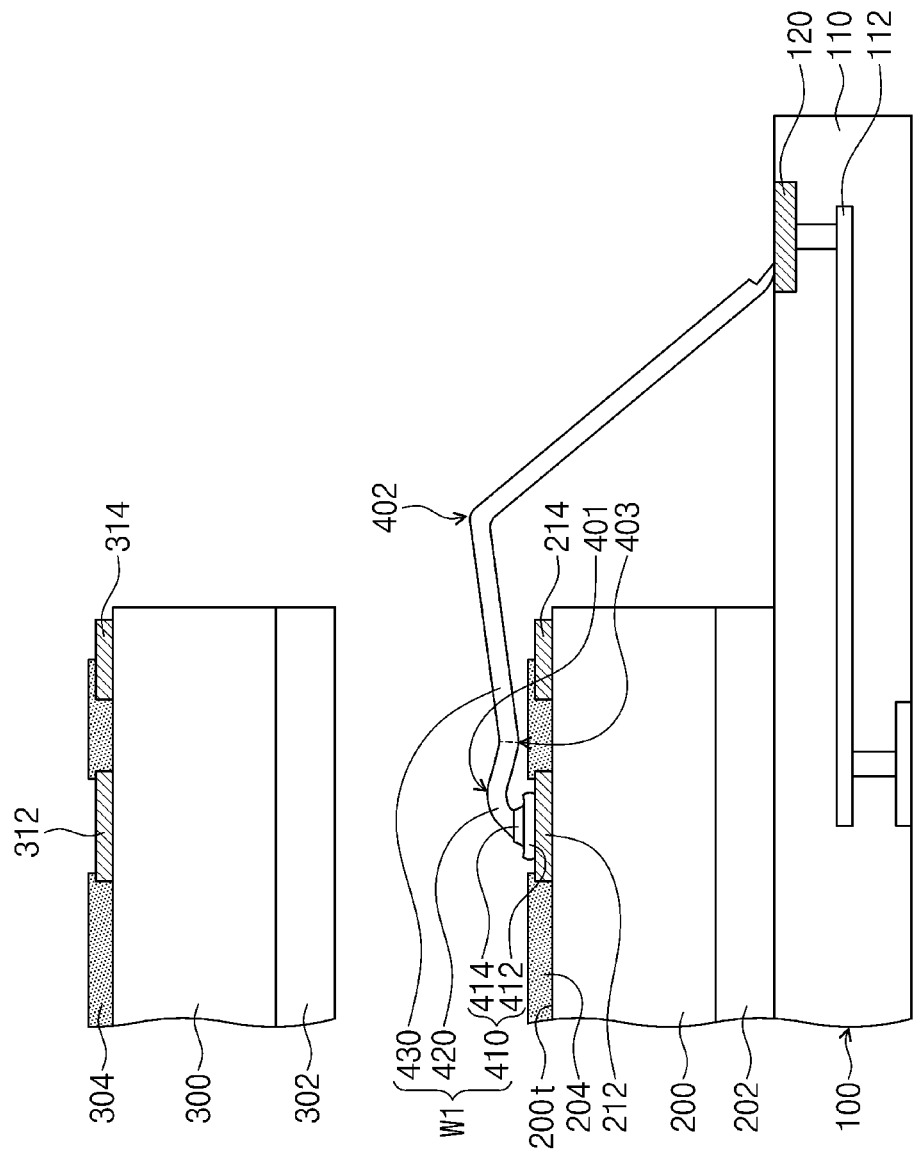

Referring to FIG. 15, according to some embodiments, a second semiconductor chip 300 is mounted on the first semiconductor chip 200. A second adhesive film 302 is disposed in advance on a bottom surface of the second semiconductor chip 300. As the second semiconductor chip 300 is mounted on the first semiconductor chip 200, the second adhesive film 302 partially covers the first bonding wire W1. Afterwards, the second adhesive film 302 is cured by a heating process.

Referring back to FIG. 1, according to some embodiments, a second bonding wire W2 is formed that connects a second chip pad 312 of the second semiconductor chip 300 to one of a plurality of upper conductive pads 120. The formation of the second bonding wire W2 is similar to that of the first bonding wire W1. Thereafter, a molding member 150 is formed that covers a top surface of the substrate 100, the first semiconductor chip 200, and the second semiconductor chip 300. The formation of the molding member 150 includes coating a molding material on the top surface of the substrate 100, and performing a curing process to cure the molding material.

According to some embodiments of the present inventive concepts, a semiconductor package is provided with reduced loop heights of the bonding wires and more reliable connection structures.

Although embodiments of the present inventive concepts have been described in connection with the accompanying drawings, it will be understood by one of ordinary skill in the art that variations in form and detail may be made therein without departing from the spirit and essential feature of embodiments of the present inventive concepts. The above disclosed embodiments should thus be considered illustrative and not restrictive.

What is claimed is:

1. A semiconductor package, comprising:
a substrate that includes an upper conductive pad;
a first semiconductor chip disposed on the substrate;
a second semiconductor chip disposed on a top surface of the first semiconductor chip that is opposite to the substrate;
a chip pad disposed on the top surface of the first semiconductor chip;
a passivation layer that covers side surfaces of the chip pad; and
a bonding wire that connects the chip pad to the upper conductive pad, wherein the wire between the chip pad and an edge of the first semiconductor chip is spaced above the first semiconductor chip,
wherein the bonding wire includes a first upward protrusion and a second upward protrusion that are convexly curved in a direction away from the substrate, and a downward protrusion located between the first upward protrusion and the second upward protrusion and that vertically overlaps the passivation layer and is convexly curved in a direction toward the substrate,
wherein the bonding wire continues to move away from the first semiconductor chip from the downward protrusion to the edge of the first semiconductor chip, and
wherein the second semiconductor chip has a first side surface located between the first upward protrusion and the second upward protrusion.

2. The semiconductor package of claim 1, wherein the downward protrusion is located between the first semiconductor chip and the second semiconductor chip.

3. The semiconductor package of claim 1, wherein
the second upward protrusion is located between the first side surface and the upper conductive pad, and
a distance between a top surface of the chip pad and a top end of the second upward protrusion ranges from about 35 μm to about 45 μm.

4. The semiconductor package of claim 1, wherein
the second upward protrusion is located between the first side surface and the upper conductive pad, and
a top end of the second upward protrusion is positioned a level higher than a level of a top end of the first upward protrusion.

5. The semiconductor package of claim 1, wherein a distance between a top surface of the chip pad and a top end of the second upward protrusion is from about 1.5 times to about 3 times a distance between the top surface of the chip pad and a top end of the first upward protrusion.

6. A semiconductor package, comprising:
a substrate that includes a top surface on which an upper conductive pad is disposed;
a first semiconductor chip disposed on the top surface of the substrate;
a chip pad disposed on a top surface of the first semiconductor chip;
a second semiconductor chip disposed on the top surface of the first semiconductor chip, wherein the second semiconductor chip includes a first side surface located between the chip pad and the upper conductive pad;
a conductive pattern disposed on the top surface of the first semiconductor chip, and
a bonding wire that connects the chip pad to the upper conductive pad,
wherein the bonding wire includes:
a first upward protrusion that is convexly curved in a direction away from the substrate;
a second upward protrusion that is convexly curved in a direction away from the substrate, wherein the second upward protrusion is positioned between the first upward protrusion and the upper conductive pad; and
a downward protrusion positioned between the first upward protrusion and the second upward protrusion and between the chip pad and the conductive pattern, wherein the downward protrusion is convexly curved in a direction toward the substrate and does not overlap the chip pad in a plan view,
wherein the first side surface is located between the downward protrusion and the second upward protrusion.

7. The semiconductor package of claim 6, wherein a vertical distance between the bonding wire and a bottom end of the first side surface of the second semiconductor chip is less than a thickness of the bonding wire.

8. The semiconductor package of claim 6, wherein a vertical distance between the bonding wire and a bottom end of the first side surface ranges from about 2 μm to about 5 μm.

9. The semiconductor package of claim 6, wherein
the second upward protrusion is located between the first side surface and the upper conductive pad, and
a vertical distance between a top surface of the chip pad and a top end of the second upward protrusion ranges from about 35 μm to about 45 μm.

10. The semiconductor package of claim 6, wherein the bonding wire includes:
a ball section coupled to the chip pad; and
a line section that extends from a top surface of the ball section and has a thickness less than a thickness of the ball section,
wherein a bottom end of the downward protrusion is located at a level lower than a level of the top surface of the ball section.

11. The semiconductor package of claim 6, wherein
the second upward protrusion is located between the first side surface and the upper conductive pad, and
a top end of the second upward protrusion is located at a level higher than a level of a top end of the first upward protrusion.

12. The semiconductor package of claim 6, wherein
the second upward protrusion is located between the first side surface and the upper conductive pad, and
a top end of the second upward protrusion is located at a level lower than a level of a bottom surface of the second semiconductor chip.

13. The semiconductor package of claim 6, wherein a vertical distance between a top surface of the chip pad and a top end of the second upward protrusion is from about 1.5 times to about 3 times a vertical distance between the top surface of the chip pad and a top end of the first upward protrusion.

14. The semiconductor package of claim 6, wherein the first semiconductor chip has a second side surface vertically aligned with the first side surface,
wherein a vertical distance between the bonding wire and a bottom end of the first side surface is less than a vertical distance between the bonding wire and a top end of the second side surface.

15. The semiconductor package of claim 6, further comprising a passivation layer that covers side surfaces of the chip pad,
wherein a bottom end of the downward protrusion vertically overlaps the passivation layer.

16. The semiconductor package of claim 6, wherein the conductive pattern is located closer to the first side surface of the second semiconductor chip than the chip pad.

17. The semiconductor package of claim 6, wherein a distance between the bonding wire and the second semiconductor chip decreases as the bonding wire approaches the first side surface from the downward protrusion.

18. A semiconductor package, comprising:
a substrate that has a top surface on which an upper conductive pad is disposed;
a first semiconductor chip disposed on the top surface of the substrate;
a chip pad disposed on a top surface of the first semiconductor chip;
a conductive pattern disposed on the top surface of the first semiconductor chip,
wherein the conductive pattern is located closer to a side surface of the first semiconductor chip than the chip pad;
a passivation layer disposed on the top surface of the first semiconductor chip, wherein
the passivation layer covers a portion of a top surface of the chip pad, and a portion of a top surface of the conductive pattern;
a second semiconductor chip disposed on a top surface of the passivation layer; and
a bonding wire that connects the chip pad to the upper conductive pad,
wherein the bonding wire includes:
a first upward protrusion that is convexly curved in a direction away from the substrate;
a second upward protrusion that is convexly curved in a direction away from the substrate, wherein the second upward protrusion is positioned between the first upward protrusion and the upper conductive pad; and
a downward protrusion positioned between the first upward protrusion and the second upward protrusion, wherein the downward protrusion is convexly curved in a direction toward the substrate,
wherein the conductive pattern is positioned between the downward protrusion and the second upward protrusion.

19. The semiconductor package of claim 18, wherein the downward protrusion vertically overlaps the top surface of the passivation layer.

20. The semiconductor package of claim 18, wherein a height between a top surface of the chip pad and a top end of the second upward protrusion is from about 1.5 times to about 3 times a height between the top surface of the chip pad and a top end of the first upward protrusion.

* * * * *